US008053261B2

(12) United States Patent
Kim

(10) Patent No.: US 8,053,261 B2
(45) Date of Patent: Nov. 8, 2011

(54) METHOD OF FABRICATING LIGHT EMITTING DEVICE

(75) Inventor: Yu-Sik Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/702,345

(22) Filed: Feb. 9, 2010

(65) Prior Publication Data

US 2010/0203657 A1    Aug. 12, 2010

(30) Foreign Application Priority Data

Feb. 9, 2009    (KR) .................. 10-2009-0010236

(51) Int. Cl.
*H01L 21/00*    (2006.01)
(52) U.S. Cl. ......... 438/29; 43/69; 43/110; 257/E21.499; 257/E21.503
(58) Field of Classification Search .................... 438/23; 257/E21.483, E21.513
See application file for complete search history.

(56) References Cited

U.S. PATENT DOCUMENTS

2004/0120379 A1*    6/2004    Kaneko et al. .................. 372/50
2005/0057813 A1*    3/2005    Hasei et al. .................. 359/619

FOREIGN PATENT DOCUMENTS

| JP | 2008-034530 | 2/2008 |
|---|---|---|
| KR | 100609970 B1 | 7/2006 |
| KR | 1020080004931 A | 1/2008 |

* cited by examiner

*Primary Examiner* — Charles Garber
*Assistant Examiner* — Cheung Lee
(74) *Attorney, Agent, or Firm* — Volentine & Whitt, PLLC

(57) ABSTRACT

A method of fabricating a light emitting device includes forming a plurality of light emitting elements on light emitting element mounting regions, respectively, of a substrate, forming lens supports on the light emitting element mounting regions, respectively, are raised relative to isolation regions of the substrate located between neighboring ones of the light emitting element mounting regions, and forming lenses covering the light emitting elements on the lens support patterns, respectively.

6 Claims, 18 Drawing Sheets

METHOD OF FABRICATING LIGHT EMITTING DEVICE

PRIORITY STATEMENT

This application is based on and claims priority from Korean Patent Application No. 10-2009-0010236, filed on Feb. 9, 2009 in the Korean Intellectual Property Office.

BACKGROUND

1. Field of the Inventive Concept

The present inventive concept relates to a method of fabricating a light emitting device having an array of light emitting elements such as light emitting diodes (LEDs).

2. Description of the Prior Art

A light emitting element such as a light emitting diode (LED) emits light through electron-hole combination. The light emitting element has low power consumption, a long lifespan, and strong anti-vibration characteristics. Also, the light emitting element can be installed in a narrow space.

Light emitting elements are classified into vertical type of light emitting elements, lateral type of light emitting elements, flip chip type of light emitting elements, and the like.

The light emitting elements, after being fabricated as individual components, are packaged to form a light emitting device. More specifically, the light emitting device includes a sub-mount onto which light emitting elements are mounted, a slug having reflectivity, leads connecting the light emitting elements to a circuit of a flexible printed circuit board, wires electrically connecting the leads to the light emitting elements, a plastic package body protecting the above-described components, a flexible printed circuit board attached to a bottom part of the package body, and a heat dissipation board for dissipating heat generated by the flexible printed circuit board.

The light emitting device transfers heat through the plastic package body. Therefore, the heat is not effectively dissipated and thus the light emitting characteristics of the device may deteriorate over time. Also, the light emitting device is made up of several separate components, including the package body. Therefore, it can be difficult to miniaturize the light emitting device.

Recently, the mounting of light emitting device to a substrate has been considered as a way to increase the dissipation of heat generated by the device. However, in the case in which light emitting elements are mounted to a substrate, it can be difficult to efficiently condense the light emitted from the respective light emitting elements.

SUMMARY

According to one aspect of the present inventive concept, there is provided a method of fabricating a light emitting device, which includes mounting light emitting elements to a substrate at light emitting element mounting regions of the substrate, respectively, forming a pattern of lens supports on the light emitting element mounting regions, respectively, and forming lenses on the lens supports over the light emitting elements, respectively. The light element mounting regions of the substrate are separated from one another by isolation regions of the substrate. Thus, each of the lens supports is raised relative to the isolation regions so as to have a step height with respect to the isolation regions.

According to another aspect of the present inventive concept, there is provided a method of fabricating a light emitting device, which includes forming a plurality of zener diodes in a surface of an undoped substrate at light emitting element mounting regions of the substrate, respectively, mounting light emitting elements on the light emitting element mounting regions of the substrate, respectively, forming a pattern of lens supports on the light emitting element mounting regions, respectively, and forming lenses on the lens supports over the light emitting elements by dispensing droplets of lens forming material on upper surfaces of the lens supports. The light emitting elements are mounted to the light mounting regions at a surface of the substrate opposite the surface in which the zener diodes are formed. Also, the light emitting mounting regions of the substrate are separated from one another by isolation regions of the substrate. Thus, each of the lens supports is raised relative to the isolation regions so as to have a step height with respect to the isolation regions.

BRIEF DESCRIPTION OF THE DRAWINGS

The present inventive concept will be better understood from the following detailed description of preferred embodiments thereof taken in conjunction with the accompanying drawings, in which.

DETAILED DESCRIPTION OF THE PREFERRED EMBODIMENTS

Figure 1A:
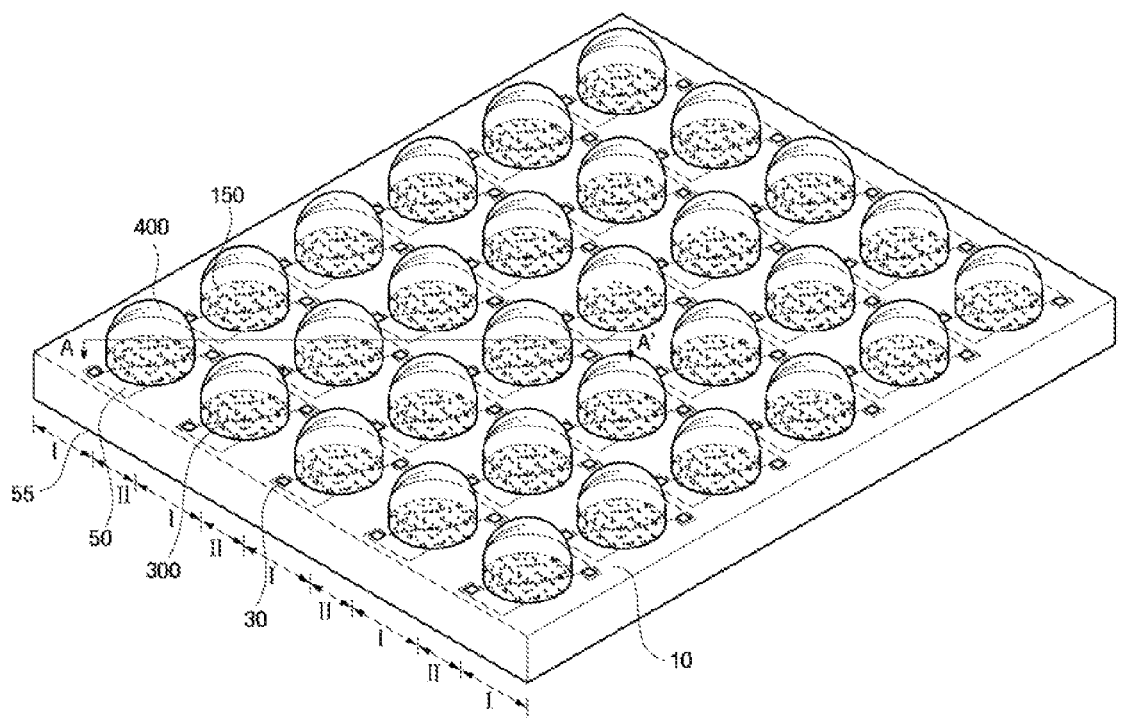
FIG. 1A is a perspective view of a light emitting device.
Figure 1B:
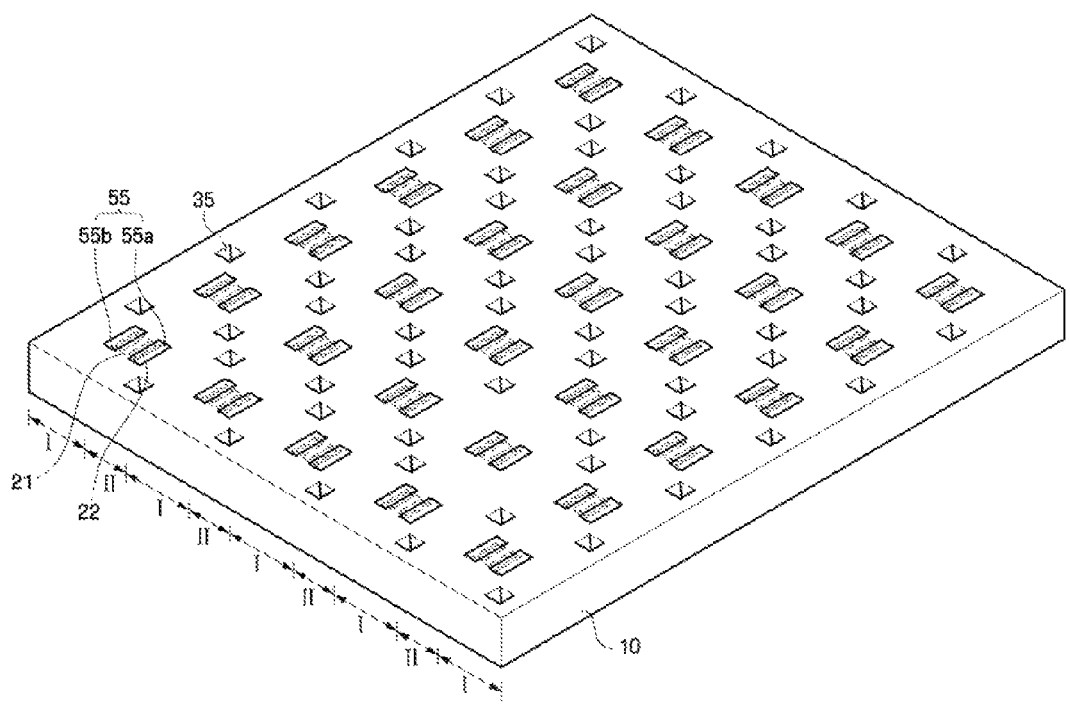
FIG. 1B is a perspective view of the bottom of the light emitting device.

Preferred embodiments of the present inventive concept will be described in detail hereinafter with reference to the accompanying drawings. Like reference numerals are used to designate like elements throughout the drawings. Also, in the drawings, the sizes and relative sizes of elements and layers, etc. may be exaggerated for clarity.

A first embodiment of a method of fabricating a light emitting device according to the present inventive concept will now be described in detail with reference to FIGS. 1A to 11.

First, referring to FIGS. 1A, 1B, 2, and 3, zener diodes 20 are embedded in a substrate 10. The substrate 10 may be a sapphire substrate, a silicon substrate, a silicon carbide (SiC) substrate, a sapphire substrate having gallium nitride formed on an upper part thereof, a silicon substrate having gallium nitride formed on an upper part thereof, or a silicon carbide substrate having gallium nitride formed on an upper part thereof.

First conductivity type semiconductor regions 21 are formed by doping the substrate 10 at a lower surface thereof with first impurities. The doping can be carried out by ion implantation, thermal diffusion, or plasma doping. The first type impurities may be P-type impurities.

Second conductivity type semiconductor regions 22 are formed by doping the substrate 10, adjacent the first conductivity type semiconductor regions 21, with second impurities having an opposite conductivity to the first impurities such that the second conductivity type semiconductor regions 22 contact the first conductivity type semiconductor regions 21. Again, the doping can be carried out by ion implantation, thermal diffusion, or plasma doping. The second impurities may be N-type impurities.

Preferably, the substrate 10 is doped such that first impurities have a relatively low density in the first conductivity type semiconductor regions 21, and such that the second impurities have a relatively high density in the second conductivity type semiconductor regions 22. For example, the doping is carried out such that the density of the first impurities is greater than $5 \times 10^{16}/cm^3$ and less than $1 \times 10^{18}/cm^3$, and the density of the second impurities is higher than that of the first impurities.

The first conductivity type semiconductor regions 21 and the second conductivity type semiconductor regions 22 form PN junctions, and constitute zener diodes 20.

Figure 2:
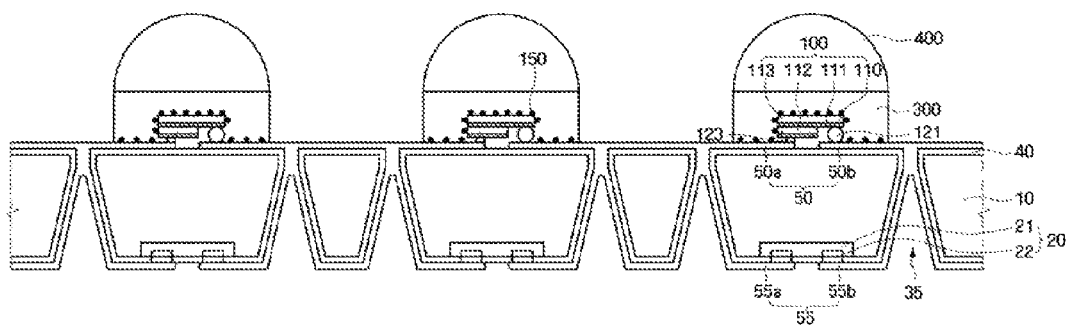
FIG. 2 is a sectional view of the light emitting device taken along line A-A' of FIG. 1A.
Figure 3:
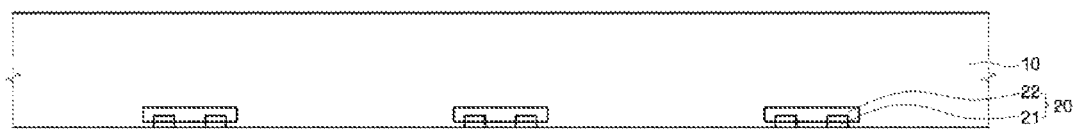
FIGS. 3 to 11 are sectional views illustrating a first embodiment of a method of fabricating the light emitting device, shown in FIGS. 1A, 1B and 2, according to the present inventive concept.
Figure 4:
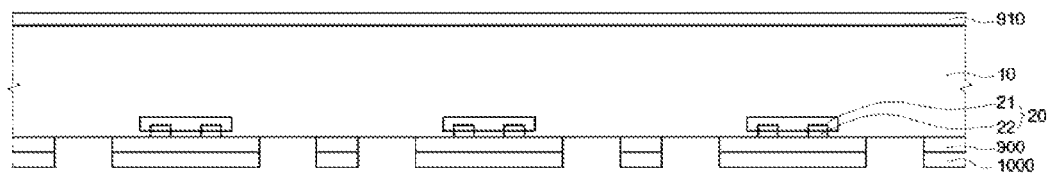

Referring to FIGS. 1A, 2, and 4, a protection pattern 900 is then formed on the lower surface of the substrate 10, and a protection layer 910 is formed on the upper surface of the substrate 10. More specifically, protection layers are formed on the lower and upper surfaces of the substrate 10, respectively. Then, a first photoresist pattern 1000 is formed over the protection layer formed on the lower surface of the substrate 10. Then the protection layer formed on the lower surface is etched using the first photoresist pattern 1000 as an etching mask to form the protection pattern 900. At this time, the first photoresist pattern 1000 and the protection pattern 900 expose regions of the device at boundaries between light emitting element mounting regions I and isolation regions II (described later on in more detail). The protection pattern 900 and the protection layer 910 may be formed of silicon nitride or silicon oxide.

Figure 5:
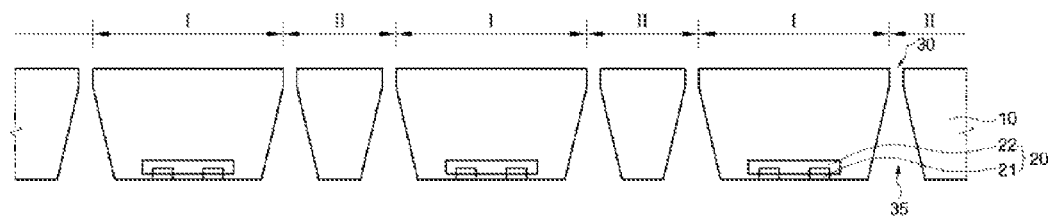

Referring to FIGS. 1A, 1B, 2, 4, and 5, the substrate 10 is then etched using the protection pattern 900 as an etching mask. In this respect, the substrate 10 may be anisotropically wet etched. In this case, the wet etching is performed using a wet etching solution such as a KOH solution. The first photoresist pattern 1000 is dissolved by the KOH solution. Also, at this time, the protection layer 910 prevents the upper surface of the substrate 10 from being damaged by the KOH solution. Accordingly, as illustrated in FIG. 5, pyramidal grooves 35, each having a cross-sectional area that gradually decreases from one surface of the substrate 10 towards the other, are formed in the substrate 10. As is also illustrated in FIG. 5, each groove 35 may have a V-shaped the profile. As a result, at least one groove 35 is formed at the border between neighboring light emitting element mounting regions I. In this embodiment of the present inventive concept, two grooves 35 are formed at the border between neighboring light emitting element mounting regions I. However, the inventive concept is not limited to any particular of number of grooves being formed at the border between neighboring light emitting element mounting regions.

The substrate 10 is exposed to the wet etching solution until a hole 30, constituting an opening in the upper surface of the substrate 10, is formed at the end of each groove 35. As described above, the protection layer 910 is formed on the upper surface of the substrate 10. Therefore, the etching of the substrate to form the grooves 35 may be stopped by the protection layer 910.

Figure 6:
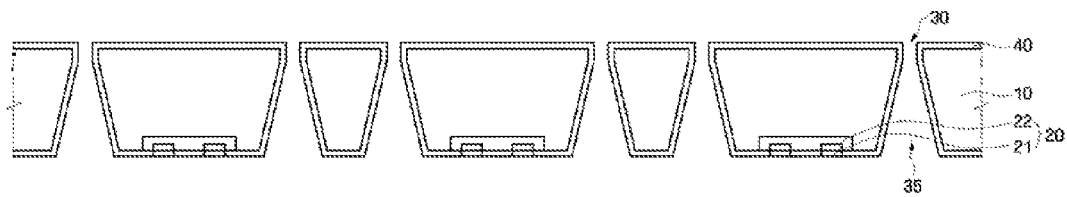

After the grooves 35 and the through-holes 30 are formed, any remnants of protection pattern 900 and protection layer 910 are removed by, for example, buffered oxide etchant (BOE) or hydrofluoric acid (HF). Referring to FIG. 6, a protection layer 40 comprising an oxide is then formed on the exposed substrate 10, by for example, a thermal oxidation method.

Figure 7:
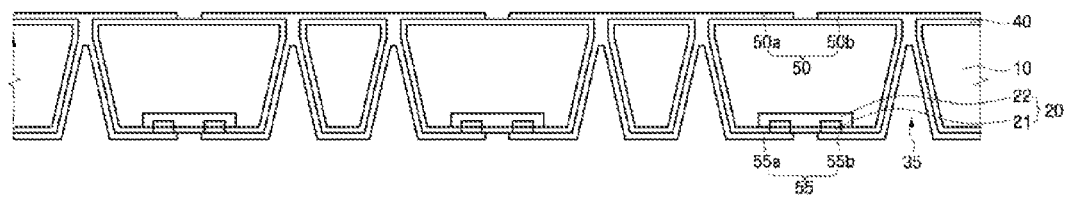

Referring to FIG. 7, a set 55 of rear electrodes is then formed on the lower surface of the substrate 10, and a set of front electrodes 50 is formed on the upper surface of the substrate 10. The forming of the front electrode set 50 and the rear electrode set 55 may be performed sequentially in any order.

In order to form the front electrode set 50, a conductive layer is formed on the upper surface side of the substrate 10 using, for example, a sputtering method or an electroplating method. The conductive layer is preferably formed of at least one material, having a superior conductivity and adhesion with respect to the protection layer 40, selected from the group consisting of Ti, Pt, Au, Cr, Ni, Cu, and Ag. The conductive layer is then patterned to form a first front electrode 50a and a second front electrode 50b spaced apart from each other.

The rear electrode set 55 may be formed using the same material and process as the front electrode set 50. Thus, the rear electrode 55 set may be made up of first and second rear electrodes 55a and 55b. The rear electrode set 55 contacts the front electrode set 50 through the through-holes 30. Specifically, each first rear electrode 55a may contact a respective first front electrode 50a, and each second rear electrode 55b may contact a respective second front electrode 50b. Furthermore, each first rear electrode 55a and second rear electrode 55b overlap a first type semiconductor region 21 of a zener diode 20. Similarly, the first and second rear electrodes 55b overlap the second type semiconductor region 22 of the zener diode 100.

Figure 8:
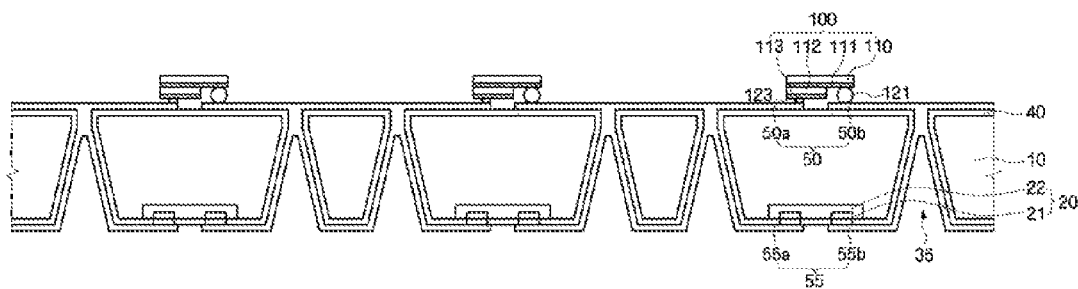

Referring to FIG. 8, light emitting elements 100 are mounted to the front electrode set 50 at the upper surface of the substrate 10, i.e., opposite the surface in which the zener diodes 20 are formed. Each light emitting element 100 may be a blue light emitting element that generates blue light. In the case in which an excessive voltage is applied to a light emitting element 100 due to static electricity, the zener diode 20 associated therewith forms a bypass for the current to prevent the light emitting element 100 from being damaged.

Each light emitting element is a component that produces light when a voltage is applied thereto (through the front electrodes 50a and 50b), i.e., is an individual light source. To this end, each light emitting element 100 includes a light emitting element support substrate 110, and a first conduction type first conductive pattern 111, a light emitting pattern 112, and a second conduction type second conductive pattern 113, which are laminated in the foregoing sequence on the light emitting element support substrate 110. These layers will now be described in more detail.

The first conductive pattern 111 may be of a first conduction type (e.g., n-type), and the second conductive pattern 113 is of a second (i.e., the opposite) conduction type (e.g., p-type).

The light emitting pattern 112 corresponds to a region in which carriers (e.g., electrons) of the first conductive pattern 111 and carriers (e.g., holes) of the second conductive pattern 113 combine to generate light. In this respect, the light emitting pattern 112 may be formed of a well layer and a barrier layer. In this case. Carriers (i.e., electrons and holes) accumulate and combine in the well layer because the well layer has a band gap that is smaller than that of the barrier layer. The light emitting pattern 112 may have a signal quantum well (SQW) structure or a multiple quantum well (MQW) structure. A SQW structure would have only one well layer, and an MQW structure would include multiple well layers. Furthermore, at least one of the well layer and the barrier layer may be doped with at least one of B, P, Si, Mg, Zn, Se, and Al to establish a desired or particular light emitting characteristic of the light emitting element 100.

Although not illustrated in the drawing, a first electrode may be formed on the first conductive pattern 111. The first electrode may be made of a transparent or opaque metal. The first electrode may include at least one of indium thin oxide (ITO), copper (CU), nickel (Ni), chrome (Cr), gold (Au), titanium (Ti), platinum (Pt), aluminum (Al), vanadium (V), tungsten (W), molybdenum (Mo), and silver (Ag).

A second electrode (not illustrated) may be formed on the second conductive pattern 113. The second electrode may be made of a material having a high reflectivity. For example, the second electrode may be made of at least one of silver (Ag) and aluminum (Al).

The light emitting element 100 may be mounted on the front electrode set 50 in a flip-chip manner. In this respect, the light emitting element 100 may be mounted using solder 121 and 123. For example, AgSn, PbSn, or AuSn is used as the solder 121 and 123. The solder 121 connects the first conductive pattern 111 to the second front electrode 50b, and the solder 123 connects the second conductive pattern 113 to the first front electrode 50a. However, it should be noted that the first conductive pattern 111 and the second conductive pattern 113 may be connected to either of the first and second front electrodes 50 and 50b, respectively, for each light emitting element 100.

Referring to FIGS. 1A to 9, an insulating layer 200 is then formed on the substrate 10 over the light emitting elements 100 and the front electrode set 50. The insulating layer 200 may be formed using a spin coating method, a drop method, or a spray coating method. The insulating layer 200 may be a layer of silicon resin, and serves to protect the light emitting elements 100. Also, the insulating layer 200 is preferably formed to a thickness of 100 to 300 μm.

The insulating layer 200 may also include phosphors 150. The phosphors 150 may be mixed with silicon resin that forms the body of the insulating layer 200, and may be spread on the substrate 10 using a spin coating method, drop method, or spray coating method.

In this embodiment of the present inventive concept, the insulating layer 200 is formed by depositing phosphors 150 on the substrate 10, and subsequently forming and curing a layer of silicon resin on the substrate 10. Accordingly, the phosphors 150 cover the upper and side surfaces of the light emitting elements 100 and the upper surface of the substrate 10, and thus the light emitted from the light emitting element 100 radiates into the air via the phosphors 150.

The phosphors 150 may include those which generate red light, yellow light, and green light. To this end, the following phosphors may be used.

The phosphors 150 may be selected from the group consisting of nitride/oxynitride-based phosphors mainly vitalized by lanthanoid elements such as Eu, Ce, and the like, alkaline-earth halogen apatite phosphors mainly vitalized by lanthanoid elements such as Eu and transition metallic elements such as Mn, alkaline-earth metal boric acid halogen phosphors, alkaline-earth metal aluminate phosphors, rare-earth aluminate mainly vitalized by lanthanoid elements such as alkaline-earth silicate, alkaline-earth emulsion, alkaline-earth thiogallate, alkaline-earth silicon nitride, germanate, and Ce, and organic and organic complexes mainly vitalized by lanthanoid elements such as rare-earth silicate and Eu.

The nitride-based phosphors mainly vitalized by lanthanoid elements such as Eu, Ce, and the like, may be $M_2Si_5N_8$:Eu (wherein M is at least one of Sr, Ca, Ba, Mg, and Zn). The nitride-based phosphors may additionally include $MSi_7N_{10}$:Eu, $M_{1.8}Si_5O_{0.2}N_8$:Eu, $M_{0.9}Si_7O_{0.1}N_{10}$:Eu (wherein M is at least one of Sr, Ca, Ba, Mg, and Zn).

The oxynitride-based phosphors mainly vitalized by lanthanoid elements such as Eu, Ce, and the like, may be $MSi_2O_2N_2$:Eu (wherein M is at least one of Sr, Ca, Ba, Mg, and Zn).

The alkaline-earth halogen apatite phosphors mainly vitalized by lanthanoid elements such as Eu and transition metallic elements such as Mn may be $M_5(PO_4)_3X$:R (wherein M is at least one of Sr, Ca, Ba, Mg, and Zn, X is at least one of F, Cl, Br, and I, and R is at least one of Eu, Mn, and Eu).

The alkaline-earth metal boric acid halogen phosphors may be $M_2B_5O_9Z$:R (wherein M is at least one of Sr, Ca, Ba, Mg, and Zn, X is at least one of F, Cl, Br, and I, and R is at least one of Eu, Mn, and Eu).

The alkaline-earth metal aluminate phosphors may be $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{27}$:R (wherein R is Eu, Mn, or Eu).

The rare-earth emulsion phosphors may be $La_2O_2S$:Eu, $Y_2O_2S$:Eu, $Gd_2O_2S$:Eu, and the like.

The rare-earth aluminate phosphors mainly vitalized by lanthanoid elements such as Ce may be $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, yttrium aluminum garnet (YAG) phosphors represented in a composition equation of $(Y,Gd)_3(Al,Ga)_5O_{12}$, and the like. Also, the rare-earth aluminate phosphors may be $Tb_3Al_5O_{12}$:Ce, $Lu_3Al_5O_{12}$:Ce, and the like, in which a part or the entire part of Y has been replaced by Tb, Lu, and the like.

The alkaline-earth silicate phosphors may be formed of silicate, and representative phosphors of $(SrBa)_2SiO_4$:Eu and the like.

Other phosphors may be SnS:Eu, $Zn_2GeO_4$:Mn, $MGa_2S_4$:Eu, and the like (wherein M is at least one of Sr, Ca, Ba, Mg, and Zn, and X is at least one of F, Cl, Br, and I).

The above-described phosphors may also contain Tb, Cu, Ag, Au, Cr, Nd, Dy, Co, Ni, and Ti, substituted for or in addition to Eu.

Figure 9:
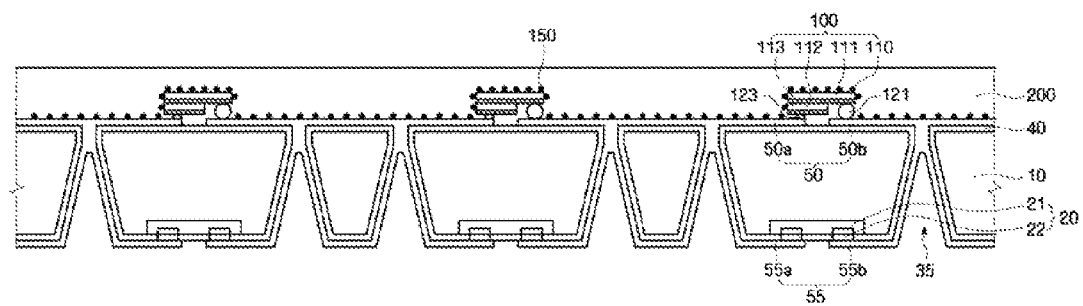
Figure 10:
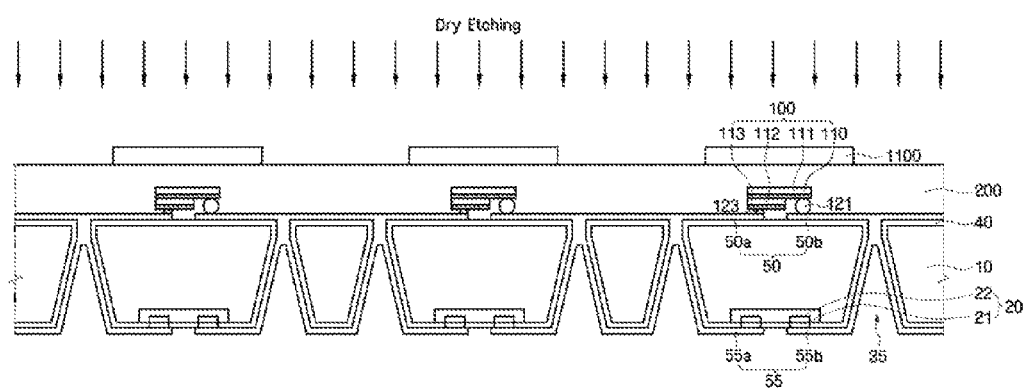

Referring now to FIGS. 1A, 9, and 10, a second photoresist pattern 1100 is formed on the insulating layer 200. In this embodiment of the inventive concept, the second photoresist pattern 1100 is formed so as to have discrete circular segments each centered over (vertically aligned with) a respective light emitting element 100.

Figure 11:
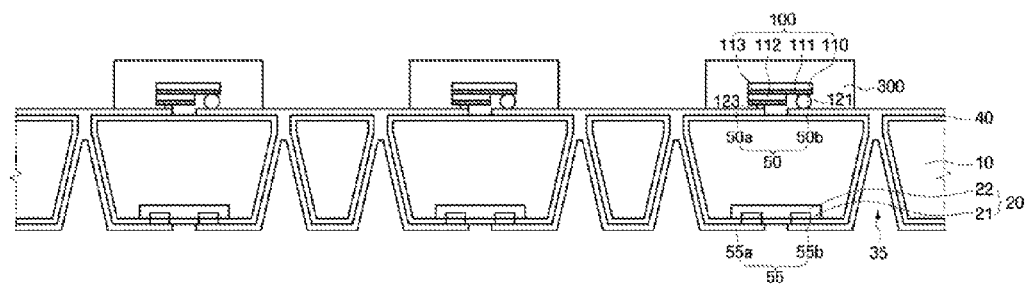

Then, the insulating layer 200 is etched using the second photoresist pattern 110 as an etching mask. The etching may be carried out by a dry etching process. Accordingly, the insulating layer 200 is etched in a vertical direction, i.e., a direction perpendicular to the upper and lower surfaces of the substrate 10. As a result, that portion of the insulating layer 200 disposed on the isolation regions II is removed, and the remaining portion of the insulating layer 200 forms a pattern of light supports 300, as illustrated in FIG. 11.

Thus, the pattern of lens supports 300 has a step height relative to the upper surface of the substrate 100. Also, in this case, and as best shown in FIG. 1A, the lens supports 300 are cylindrical in accordance with the shape of the second photoresist pattern 1100, each cylindrical lens support 300 covering a light emitting element 100.

Referring to FIGS. 1A, 2, and 12A to 12C, a lens 400 is then formed on each lens support 300. The lenses 400 serve to condense light emitted from the light emitting elements 100.

An inkjet printing method may be used to form the lenses 400. Specifically, the lens forming process may be performed using a micro inkjet method to cover at least part of the upper surface of each lens support 300 with a droplet of, for example, silicon resin. Then, the droplet is cured to strengthen the resultant lens 400. Also, depending on the step height of the pattern of lens supports 300, the lenses 400 may be formed so as to cover part of the side surface of the pattern of lens supports 300 and the isolation region II.

In this embodiment of the present inventive concept, each lens 400 is formed so as to be hemispherical due to the surface tension provided at the edge of the upper surface of the lens support 300. That is, the upper surface of each lens support 300 is circular. Accordingly, the bottom surface of the lens 400 will be circular, and the lens will have the shape of a segment of a sphere.

Figure 12A:
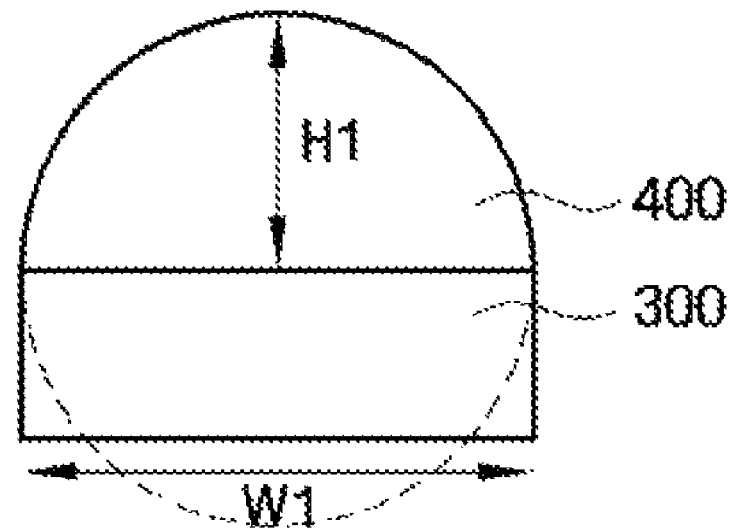
FIGS. 12A to 12C are schematic diagrams of a lens support pattern and lens of the light emitting device.
Figure 12B:
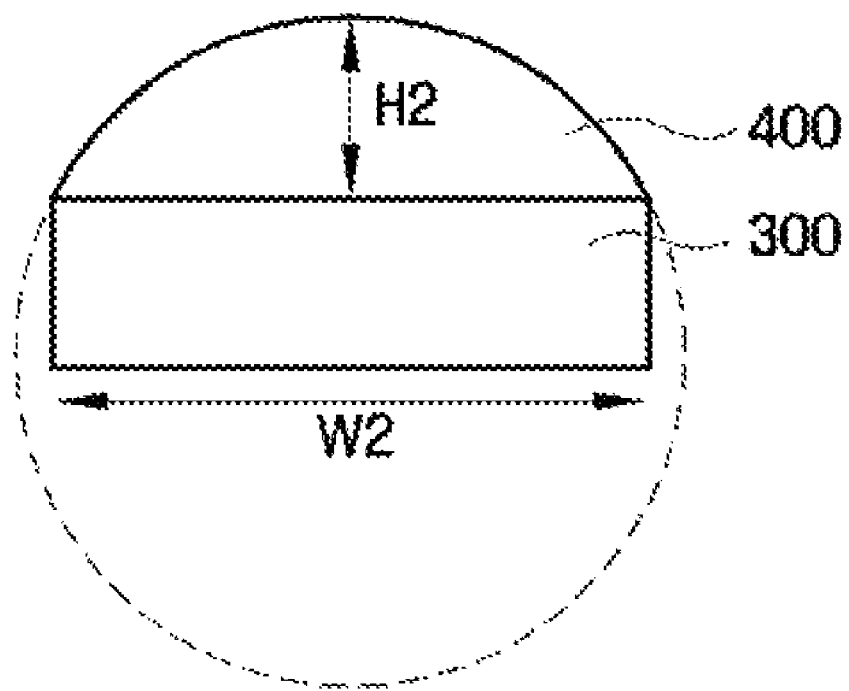
Figure 12C:
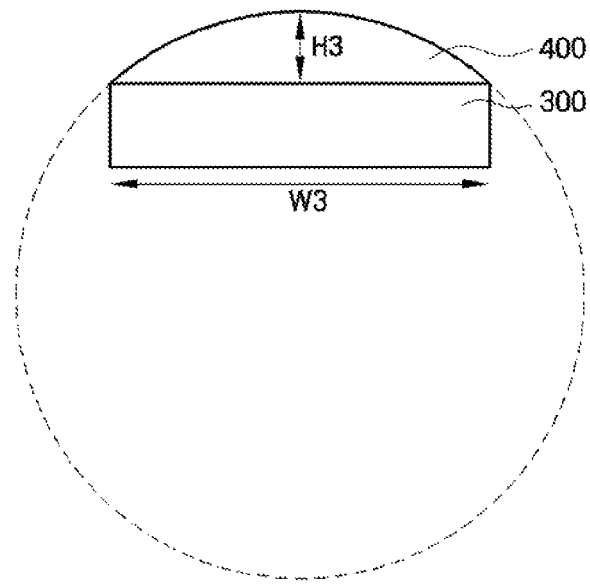

In this respect, FIGS. 12A to 12C show that as the width w1, w2, or w3 of the lens support pattern 300 increases, the radius of curvature of the lens 400 becomes larger for lenses of the same volume.

Specifically, as illustrated in FIG. 12A, if the lens support 300 is narrow, the lens 400 has a relatively great height H1. In this case, the lens 400 provides a high degree of directionality to the light emitted by the light emitting device 100 covered by the lens 400. As illustrated in FIGS. 12B and 12C, the wider (w2, w3) the lens support pattern 300 is, the greater is the surface tension between the lens support 300 and the droplet (of silicon resin) used to form the lens (assuming that the droplets all have the same volume), and the smaller the droplet becomes in terms of its height (H2, H3). As illustrated in FIG. 12C, the lens 400 having a large radius of curvature provides the greatest degree of uniformity in dispersing the light emitted by the light emitting element 100 covered by the lens.

Accordingly, the above-described method facilitates the forming of lenses 400 optimized with respect to providing any one of several different effects. Such optimized lenses 400 can be produced simply by forming lens supports 300 to specific predetermined dimensions (widths), and dispensing droplets of predetermined volumes of transparent (lens) material onto the lens supports 300.

Referring again to FIGS. 1A and 2, the lenses 400 are preferably made of a material whose index of refraction is lower than or equal to that of the pattern of lens supports 300. Accordingly, the light emitted from a light emitting element 100 sequentially passes through a lens support 300 and a lens 400, and into the air. In this case, the indices of refraction of the lens support 300, the lens 400, and the air decrease in the foregoing order. Therefore, the phenomenon of internal reflection is minimized and thus, the optical emission efficiency is maximized.

As is clear from the description above, the method according to the inventive concept facilitates the forming of various arrangements light emitting elements on a substrate. For example, according to the inventive concept, light emitting elements may be formed in a one- or two-dimensional array, i.e., in a periodic arrangement. Also, the light emitting elements 100 of the light emitting device can each emit red, green, or blue light. Also, the lenses 400 and the insulating layer 200 are formed by discrete processes in the manner described above. Therefore, the lenses 400 are less likely to be damaged compared to a case in which a pre-fabricated sheet of lenses on an insulating layer is attached to a substrate 10.

Figure 13:
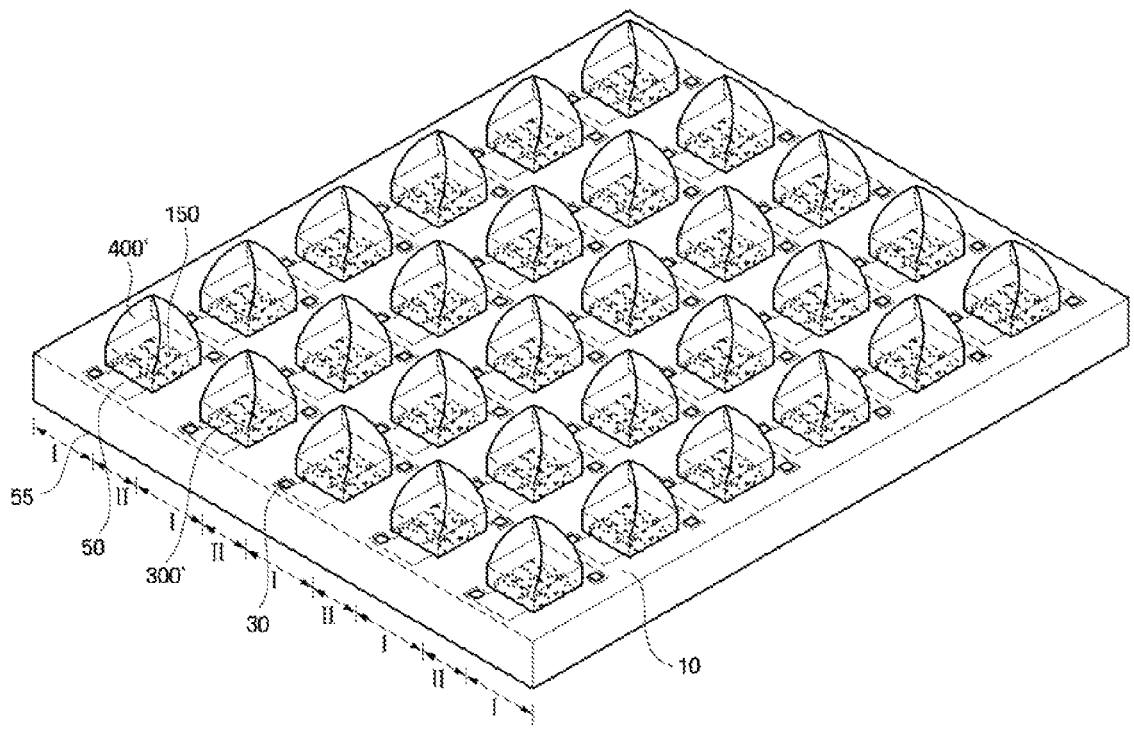
FIG. 13 is a perspective view of another example of a light emitting device fabricated by the first embodiment of the method according to the present inventive concept.

FIG. 13 shows another light emitting device fabricated according to the present inventive concept. This light emitting device is fabricated as follows.

Light emitting devices are formed on a substrate 10 using processes described above with reference to FIGS. 3 to 11.

In this case, though, the upper surface of each segment of the photoresist pattern 1100 (FIG. 10) has the shape of a quadrangle. Accordingly, as illustrated in FIG. 13, each lens support 300' is formed as a parallelepiped (a pillar with quadrangular sides), and each lens 400' is formed in the shape of a pyramid having a quadrangular base, curved sides and curvilinear edges.

Figure 14:
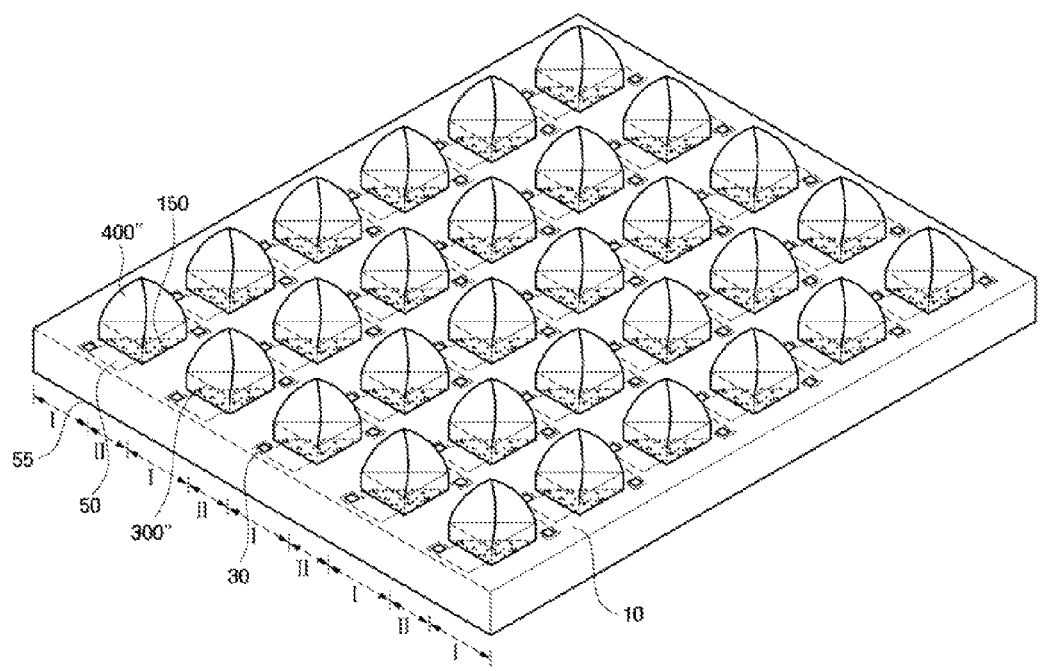
FIG. 14 is a perspective view illustrating still another example of a light emitting device fabricated by the first embodiment of the method according to the present inventive concept.

FIG. 14 shows another light emitting device fabricated according to the present inventive concept. This light emitting device is fabricated as follows.

Light emitting devices are formed on a substrate 10 using processes as described above with reference to FIGS. 3 to 11.

In this case, though, the upper surface of each segment of the photoresist pattern 1100 (FIG. 10) has the shape of a triangle. Accordingly, as illustrated in FIG. 14, each lens support 300'' is formed as a triangular pillar, and each lens 400'' is formed in the shape of a pyramid having a triangular base, curved sides and curvilinear edges.

Although a first embodiment of a method of fabricating a light emitting device according to the inventive concept has been described above with respect to the forming of specifically shaped lens supports and lenses, the inventive concept is not so limited. That is, is should be clear that the inventive concept can be practiced to fabricate a light emitting device whose lens supports and lenses have shapes other than those specifically described above.

Next, a second embodiment of the present inventive concept will be described in detail with reference to FIGS. 3 to 7, 9 to 11, 15 and 16.

First, the sets of front rear electrodes 50 and 55 are formed using processes as described above with reference to FIGS. 3 to 7.

Figure 15:
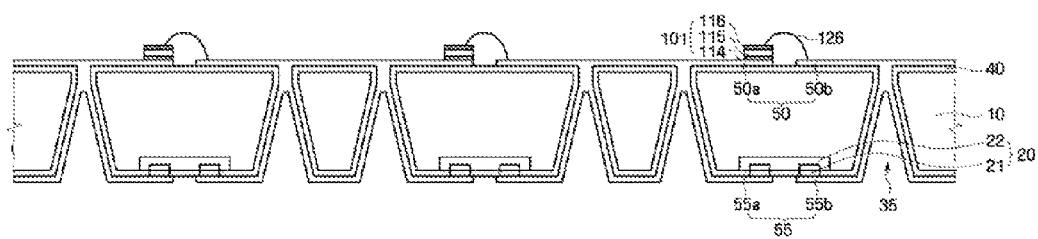
FIGS. 15 and 16 are sectional views illustrating a second embodiment of a method of fabricating a light emitting device according to the present inventive concept.
Figure 16:
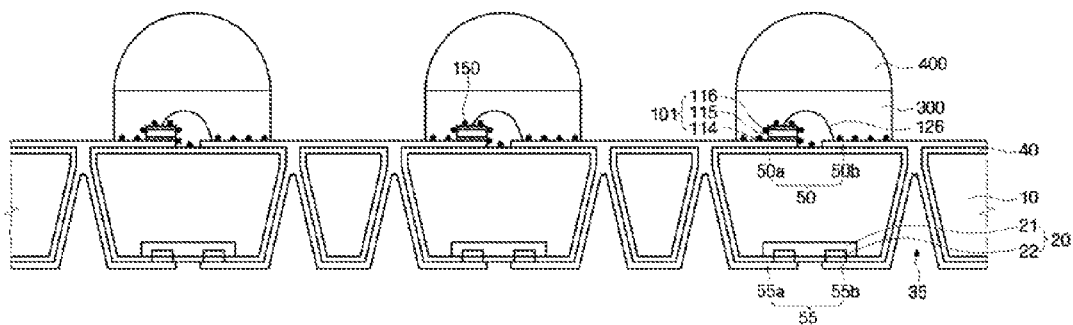

Referring to FIG. 15, light emitting elements 101 are then electrically connected to the front electrode set 50. In this embodiment of the present inventive concept, each light emitting element 101 includes a laminate of a first conduction type first conductive pattern 114, a light emitting pattern 115, and a second conduction type second conductive pattern 116. The first conductive pattern 114 is directly connected to a front electrode 50a, and the second conductive pattern 116 is connected to a second front electrode 50b by a wire 126. Then, the light emitting device having lens supports 300 and lenses 400, as illustrated in FIG. 16, is completed using processes as described above with reference to FIGS. 8 to 11. In this regard, the second embodiment can be used to form lens supports and lenses of any of the other shapes described above.

Next, a third embodiment of a method of fabricating a light emitting device according to the present inventive concept will be described in detail with reference to FIGS. 3 to 7, 9 to 11, 17, and 18.

First, the sets of front rear electrodes 50 and 55 are formed using processes as described above with reference to FIGS. 3 to 7.

Figure 17:
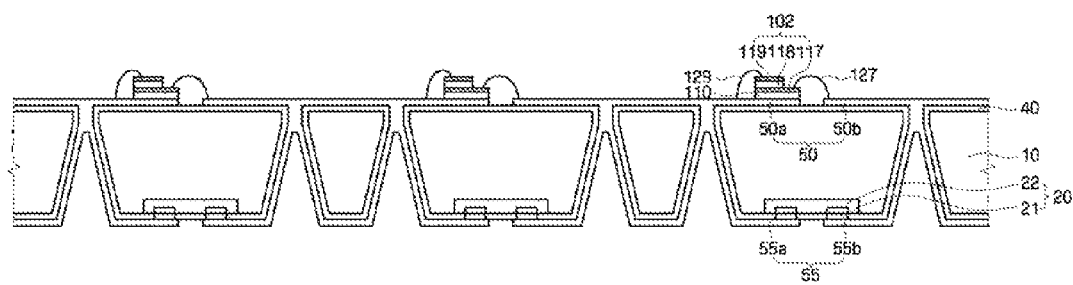
FIGS. 17 and 18 are sectional views illustrating a third embodiment of a method of fabricating a light emitting device according to the present inventive concept.
Figure 18:
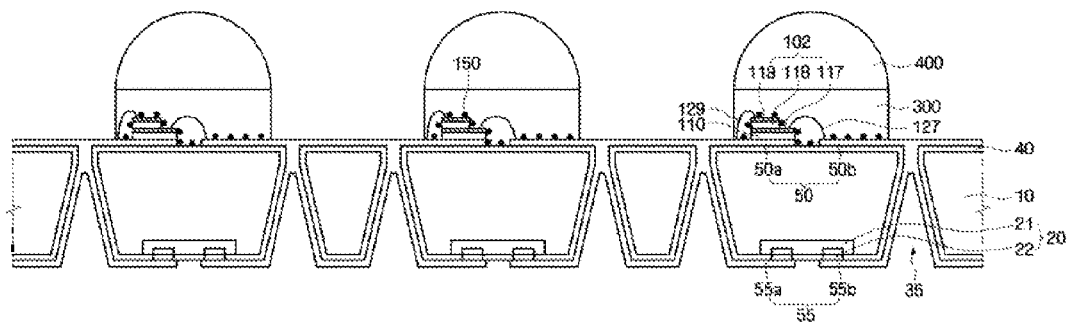

Referring to FIG. 17, light emitting elements 102 are then electrically connected to the front electrode set 50. In this embodiment of the present inventive concept, the light emitting element 102 includes a laminate of a first conduction type first conductive pattern 117, a light emitting pattern 118, and a second conduction type second conductive pattern 119. The first conductive pattern 117 is connected to the second front electrode 50b by a first wire 127, and the second conductive pattern 119 is connected to the first front electrode 50a by a second wire 129. Then, the light emitting device having lens supports 300 and lenses 400, as illustrated in FIG. 18, is completed using processes as described above with reference to FIGS. 8 to 11. In this regard, the third embodiment can be used to form lens supports and lenses of any of the other shapes described above.

Next, a method of fabricating a light emitting device, using one technique, according to the present inventive concept will be described in detail with reference to FIGS. 3 to 8, and 19 to 22.

First, the sets of front rear electrodes 50 and 55 are formed using processes as described above with reference to FIGS. 3 to 7. Then, light emitting elements 100 are mounted on the substrate 10 as described above with respect to FIG. 8.

Figure 19:
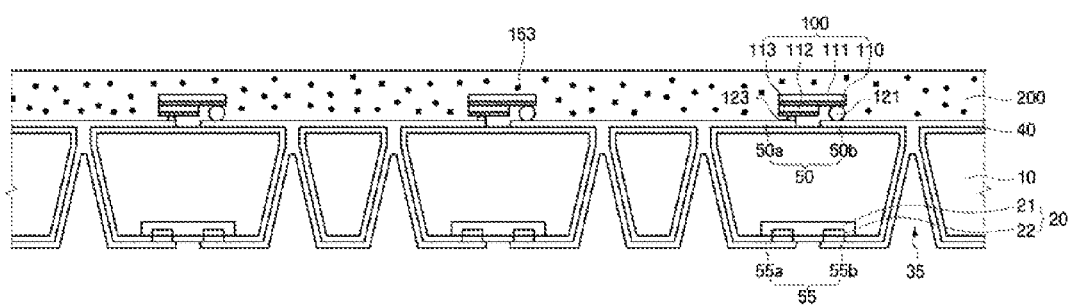
FIGS. 19 to 22 are sectional views illustrating a technique in a method of fabricating a light emitting device according to the present inventive concept.

Referring to FIG. 19, an insulating layer 200 is then formed on the substrate 10 over the light emitting elements 100 and the front electrode set 50. In this case, phosphors 153 are dispersed throughout the insulating layer 200. In this embodiment, silicon resin in which the phosphors 153 have been dispersed is spread on the substrate 10, and the resulting layer is cured to form the insulating layer 200. Accordingly, the phosphors 153 are dispersed substantially uniformly throughout the entire thickness of the insulating layer 200.

Figure 20:
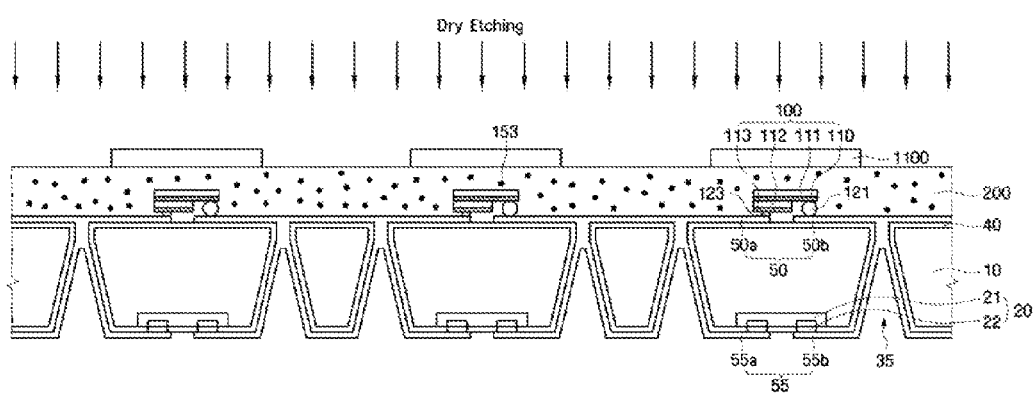

Referring to FIG. 20, a second photoresist pattern 1100 is then formed, and the insulating layer 200 is dry etched using the second photoresist pattern 1100 as an etching mask.

Figure 21:
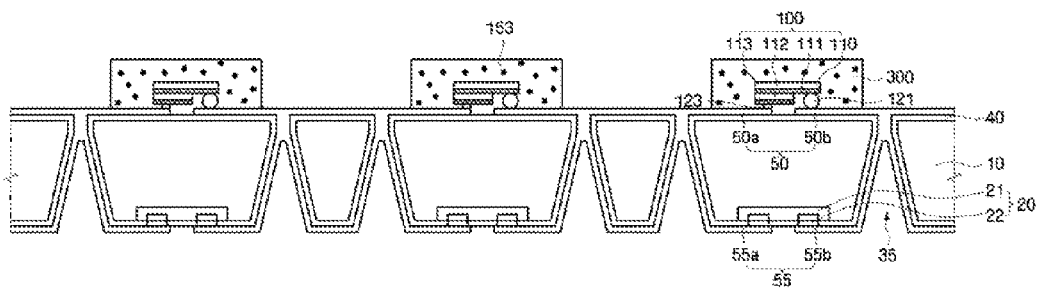

As a result, as illustrated in FIG. 21, a pattern of lens supports 300 is formed over the light emitting elements 100, and each lens support 300 has phosphors 153 dispersed substantially uniformly there throughout. Therefore, phosphors 153 surround each light emitting element 100.

Figure 22:
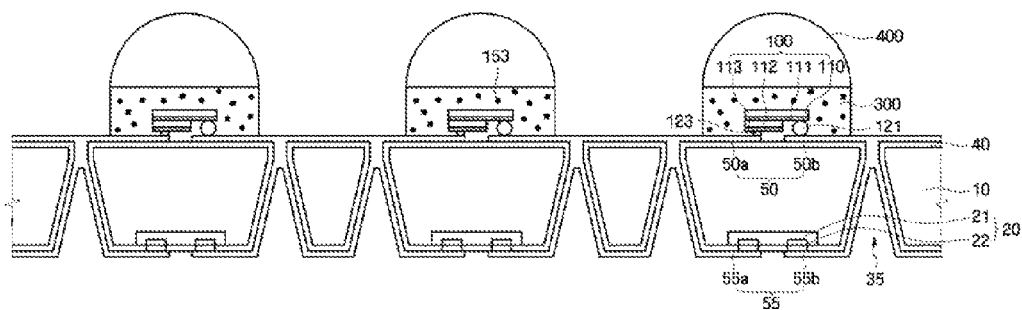

Referring to FIG. 22, lenses 400 are then formed on the lens supports 300, in the manner described above, to complete to the light emitting device.

A method of fabricating a light emitting device, using another technique, according to the present inventive concept, will be described in detail with reference to FIGS. 3 to 12, and 23.

Figure 23:
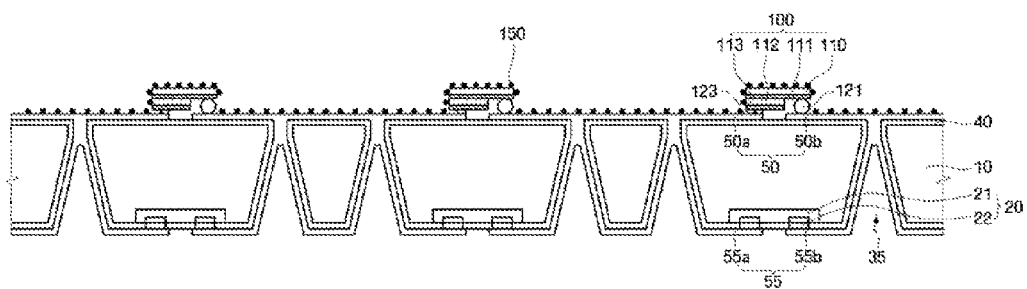
FIG. 23 is a sectional view illustrating another technique in a method of fabricating a light emitting device according to the present inventive concept.

First, the front and rear electrode sets 50 and 55 are formed using processes as described above with reference to FIGS. 3 to 8. Then, light emitting elements 100 are mounted on the substrate 10 to the front electrode set 50. Referring to FIG. 23, phosphors 150 are spread onto the substrate 10. In this case, the phosphors 150 may be dissolved in a volatile material, e.g. acetone, so that they may be easily spread across the substrate 10. Subsequently, the acetone is volatilized, e.g., by being heated, and is thereby removed. Accordingly, the phosphors 150 remain on the upper surface of the substrate 10 and the upper and side surfaces of the light emitting elements 100. Thus, the light emitted from each light emitting element 100 radiates into the air via phosphors 150.

Then, as was shown in FIG. 9, an insulating layer 200 is formed on the phosphors 150. As a result, phosphors 150 occupy only a lower part of the insulating layer 200.

Then, the light emitting device is completed using processes as described above with reference to FIGS. 10 to 12.

A method of fabricating a light emitting device, using yet another technique, according to the present inventive concept will be described in detail with reference to FIGS. 3 to 8, 10 to 12, 24, and 25.

First, front and rear electrode sets 50 and 55 are formed on a substrate 10 using processes as described above with reference to FIGS. 3 to 8. Then, light emitting elements 100 are mounted on the front electrode set 50.

Figure 24:
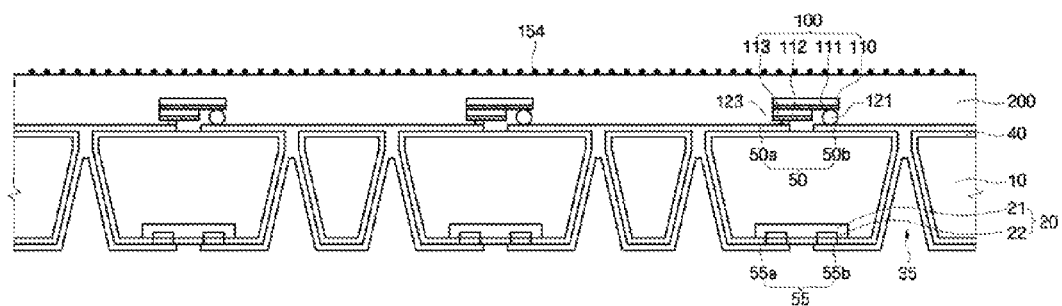
FIGS. 24 and 25 are sectional views illustrating still another technique in a method of fabricating a light emitting device according to the present inventive concept.

Referring to FIG. 24, an insulating layer 200 is then formed on the substrate 10 over the light emitting elements 100 and the front electrode set 50.

Then, phosphors 154 are spread on the insulating layer 200. In this respect, the phosphors 154 may be applied to the insulating layer 200 in the same way as described above with reference to FIG. 23.

Figure 25:
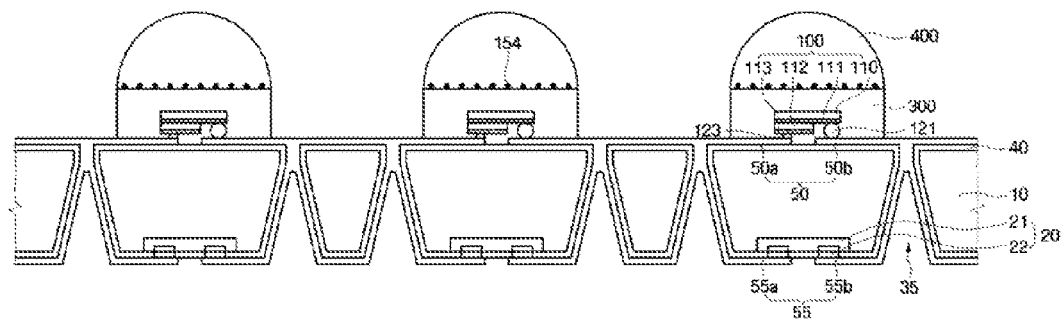

Then, light emitting device as illustrated in FIG. 25 is completed using processes as described above with reference to FIGS. 10 to 12. Thus, in this embodiment of the present inventive concept, the phosphors 154 are formed between the lenses 400 and the lens supports 300.

Next, another embodiment of a method of fabricating a light emitting device according to the present inventive concept will be described in detail with reference to FIGS. 3 to 8, 12, and 26 to 31.

First, front and rear electrode sets 50 and 55 are formed on a substrate 10 using processes as described above with reference to FIGS. 3 to 8. Then, light emitting elements 100 are mounted on the front electrode set 50.

Figure 26:
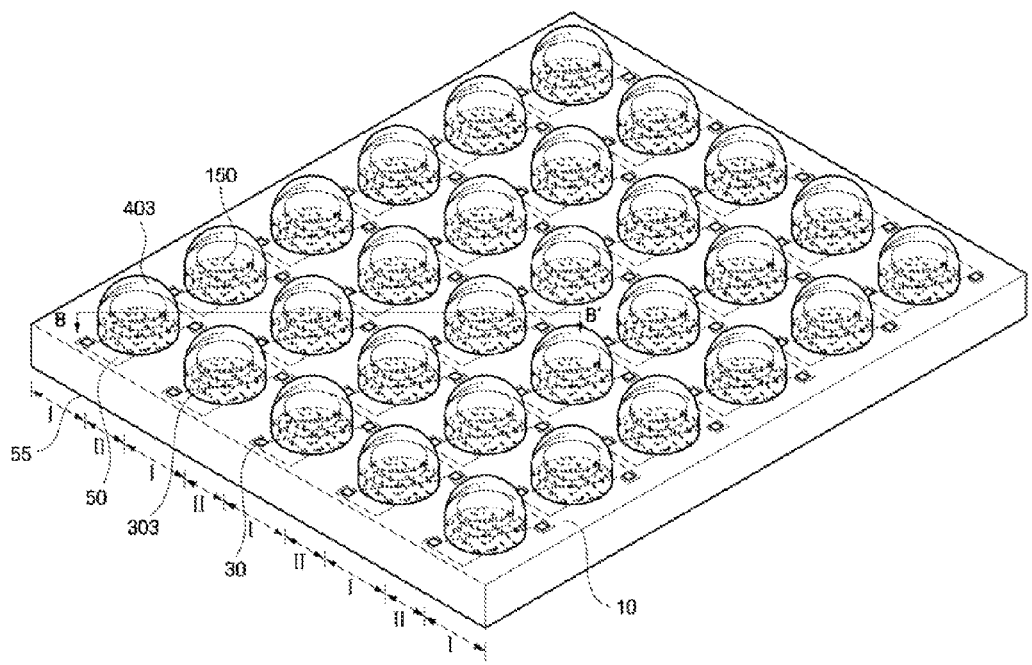
FIG. 26 is a perspective view of another light emitting device.
Figure 27:
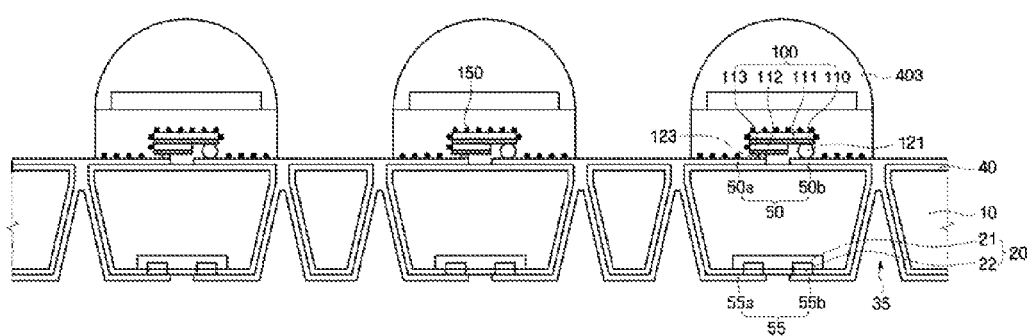
FIG. 27 is a sectional view of the light emitting device, taken along line B-B' of FIG. 26.
Figure 28:
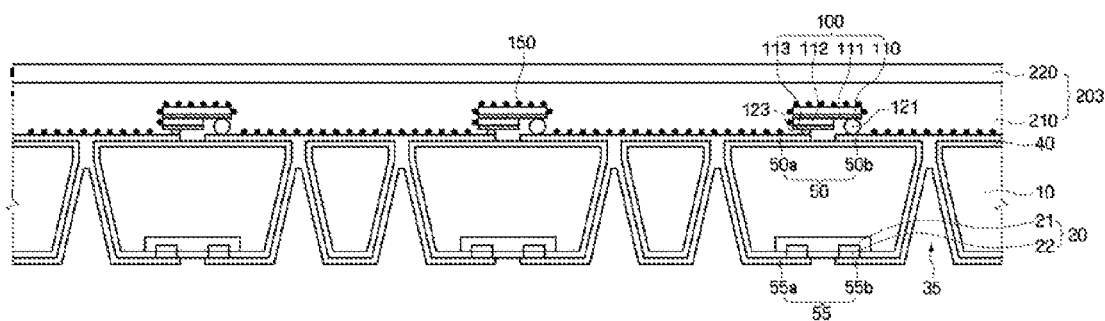
FIGS. 28 to 31 are sectional views illustrating an embodiment of a method of fabricating the light emitting device, shown in FIGS. 26 and 27, according to the present inventive concept.
Figure 29:
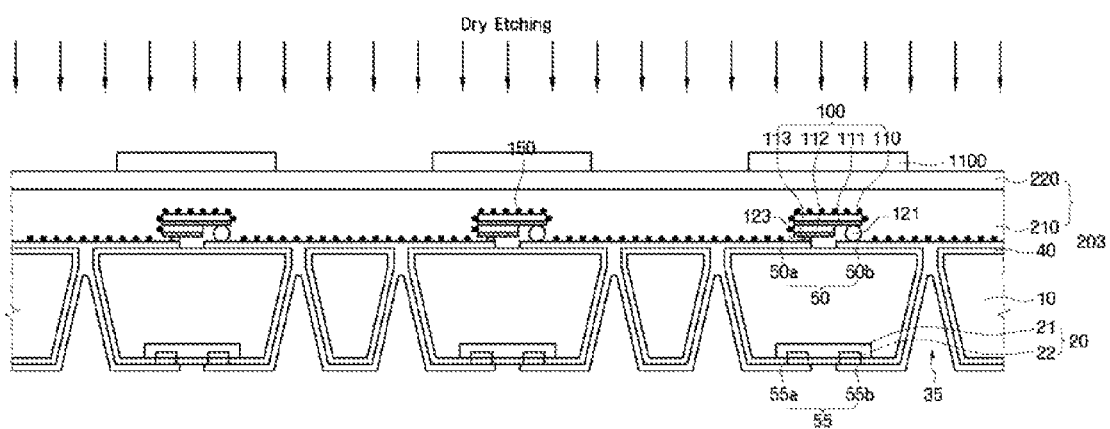

Referring to FIGS. 26 to 28, an insulating layer 203 is then formed on the substrate 10 over the light emitting elements 100 and the front electrode set 50.

In this embodiment of the present inventive concept, the insulating layer 203 is formed of multiple films of material. Specifically, a first insulating film 210 and a second insulating film 220 are sequentially formed on the substrate 10 to constitute the insulating layer 203. The first insulating film 210 is preferably of a material having an index of refraction that is higher than or equal to that of the second insulating film 220.

Referring to FIGS. 26 to 29, a second photoresist pattern 1100 is then formed on the second insulating film 220. The second photoresist pattern 110 is made up of discrete segments of photoresist which are vertically aligned with the light-emitting elements, respectively.

Then, the second insulating layer 220 is etched using the second photoresist pattern 1100 as an etching mask, thereby patterning the second insulating film 220. As a result, discrete segments of the second insulating film 220 are left over portions of the first insulating film 210 and the underlying light emitting elements 100, respectively, and the remainder of the first insulating film 210 is exposed.

Figure 30:
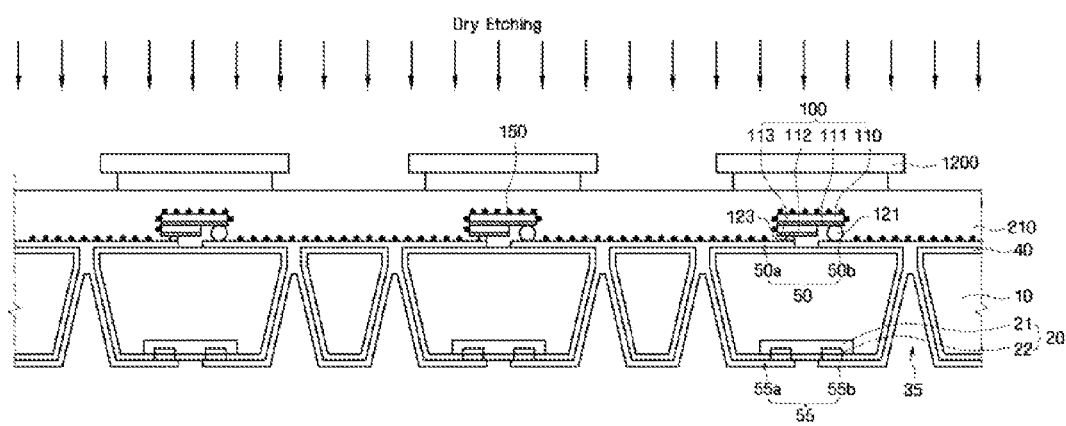
Figure 31:
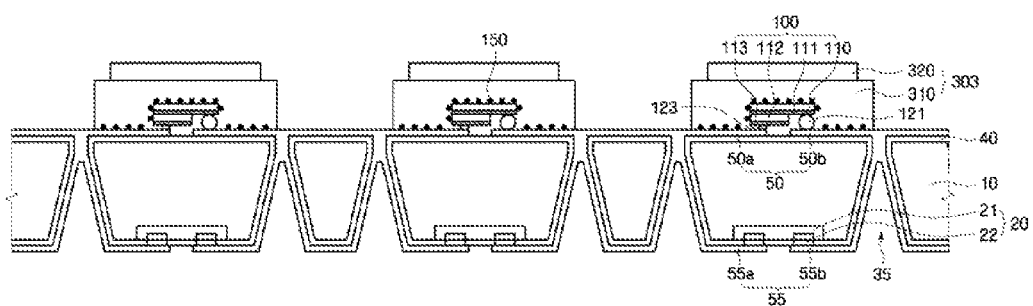

Referring to FIG. 30, a third photoresist pattern 1200 is then formed on the substrate 10 over the insulating layer. The third photoresist pattern 1200 has essentially the same pattern and alignment with the substrate 10 as the second photoresist pattern 1100. However, the discrete segments of the third photoresist pattern 1200 are wider than those of the second photoresist pattern 1100. Then, the first insulating film 210 is etched using the third photoresist pattern 1200 as an etching mask. Accordingly, as illustrated in FIG. 31, a pattern of lens supports 303 is formed in which each of the lens supports 303 has a first (lower) lens support portion 310 and a second (upper) lens support portion 320. Also, the pattern of lens supports 303 is formed such that a step is formed between the first lens support portion 310 and the second lens support portion 320 of each lens support 303.

Then lenses 403, as shown in FIGS. 26 and 27, are formed on the lens supports 303, respectively, using an inkjet method as described above with reference to FIG. 12. In this respect, each of the lenses 403 may be formed to cover the upper and side surfaces of a second lens support portions 320. Also, each lens 403 may further cover a part of the side surface of a first lens support portion 310 and the upper surface of the same first lens support portion 310.

In the light emitting device fabricated as described above according to the inventive concept, the light emitted from each light emitting element 100 sequentially passes through the first lens support pattern 310, the second lens support pattern 320, and the lens 403, and then into the air layer. The first lens support portions 310 are made of material having an index of refraction that is higher than or equal to the index of refraction of the material of the second lens support portions 320, and the index of refraction of the material of the second lens support portions 320 is higher than or equal to the index of refraction of the lenses 403. Accordingly, the phenomenon of internal reflection of the light is minimized, and thus the optical emission efficiency is optimized.

Finally, embodiments of the inventive concept have been described herein in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A method of fabricating a light emitting device, comprising:

mounting light emitting elements to a substrate at light emitting element mounting regions, respectively, of the substrate, separated from one another by isolation regions of the substrate;

forming a pattern of lens supports on the light emitting element mounting regions, respectively, wherein each of the lens supports is raised relative to the isolation regions so as to have a step height with respect to the isolation regions; and forming, on the lens supports, lenses over the light emitting elements, respectively, wherein the forming of the pattern of lens supports comprises forming, on the substrate, an insulating layer that covers the light emitting elements, and removing part of the insulating layer, wherein the forming of the insulating layer comprises sequentially forming a first insulating film and a second insulating film on the substrate, and wherein the forming of the pattern of lens supports comprises patterning the second insulating to form upper portions of the lens supports, and patterning the first insulating film to form lower portions of the lens supports each disposed beneath and wider than a respective one of the upper portions of the lens supports, whereby each of the lens supports has a step therein.

2. The method of claim 1, wherein the forming of the lenses comprises dispensing droplets of lens forming material on upper surfaces of the lens supports.

3. The method of claim 1, wherein the removing of part of the insulating layer comprises etching the insulating layer.

4. The method of claim 1, wherein the insulating layer is a material having an index of refraction that is higher than or equal to an index of refraction of the lenses.

5. The method of claim 1, further comprising providing phosphors between the light emitting element and the lenses.

6. The method of claim 1, wherein the substrate is an undoped substrate, and the method further comprises forming, in a surface of the substrate, zener diodes at the light emitting element mounting regions of the substrate, respectively, and wherein the light emitting elements are mounted to the substrate at the other surface of the substrate.

* * * * *